United States Patent [19]
Burns et al.

[11] Patent Number: 5,132,612
[45] Date of Patent: Jul. 21, 1992

[54] APPARATUS FOR ELECTROSTATIC DISCHARGE (ESD) STRESS/TESTING

[75] Inventors: Daniel J. Burns, Rome; Mark W. Levi, Utica, both of N.Y.

[73] Assignee: The United States of America as represented by the Secretary of the Air Force, Washington, D.C.

[21] Appl. No.: 669,254

[22] Filed: Mar. 14, 1991

[51] Int. Cl.⁵ .................. G01R 1/00; G01R 1/067
[52] U.S. Cl. .................. 324/158 F; 324/72.5; 324/158 P
[58] Field of Search .................. 324/72-75, 324/158 F, 158 P, 158 R

[56] References Cited

U.S. PATENT DOCUMENTS

| | | | |
|---|---|---|---|
| 3,963,986 | 6/1976 | Morton et al. | 324/158 F |
| 3,996,516 | 12/1976 | Luther | 324/158 F |
| 4,038,599 | 7/1977 | Bove et al. | 324/158 F |
| 4,232,928 | 11/1980 | Wickersham | 339/117 P |
| 4,432,360 | 2/1984 | Mumford et al. | 128/419 PG |
| 4,459,693 | 7/1984 | Prang et al. | 371/20 |
| 4,480,223 | 10/1984 | Aigo | 324/158 F |
| 4,517,512 | 5/1985 | Petrich et al. | 324/158 F |
| 4,540,227 | 9/1985 | Faraci | 339/17 F |
| 4,636,724 | 1/1987 | Fukuda et al. | 324/158 R |
| 4,677,375 | 6/1987 | Nakaie | 324/158 F |
| 4,689,721 | 8/1987 | Damerow et al. | 361/388 |
| 4,749,943 | 6/1988 | Black | 324/158 F |
| 4,758,780 | 7/1988 | Coon et al. | 324/73 PC |
| 4,779,043 | 10/1988 | Williamson, Jr. | 324/73 R |
| 4,791,357 | 12/1988 | Hyduke | 324/73 PC |
| 4,812,755 | 3/1989 | Toshiyuki et al. | 324/158 F |
| 4,833,402 | 5/1989 | Boegh-Petersen | 324/158 F |
| 4,954,772 | 9/1990 | Funakoshi | 324/158 F |
| 4,975,638 | 12/1990 | Evans et al. | 324/158 F |

Primary Examiner—Gerard R. Strecker
Assistant Examiner—William J. Burns
Attorney, Agent, or Firm—William Stepanishen; Donald J. Singer

[57] ABSTRACT

An apparatus for applying high current fast rise time pulses simulating electrostatic discharge (ESD) to various combinations of pins of a device under test (e.g., a microcircuit). The apparatus also provides for testing of the DUT after the performance of ESD stress testing. The apparatus establishes electrical connections between the terminals of a high voltage pulse generator (HVPG) and several different combinations of the DUT pins in sequence in order to apply ESD stresses. The apparatus further provides functional parameter tests whether the connection to the DUT pins during ESD stressing has caused the DUT to fail.

5 Claims, 4 Drawing Sheets

NOTES

A1. "POGO" PINS AT THESE LOCATIONS IN EACH SECTOR.

B1. INSTALL ONE JUMPER FROM A TO B, C OR D DEPENDING ON DUT PIN TYPE AT THIS SECTOR:

| JUMPER | PIN TYPE |
|---|---|
| A - B | INPUT / OUTPUT |
| A - C | GROUND |
| A - D | POWER 1 |

C1 CONNECT THIS "POGO" PIN TO CABLE TO DUT TESTER.

NOTES

1. SP. IS A SPECIAL SECTOR TO APPLY ESD STRESS TO ONE PIN

2. | SUB-POSITION | TEST MODE |
|---|---|
| 1 | DUT FUNCTIONAL / PARAMETRIC TEST |
| 2 | ESD1 I/O & GROUNDS TO POWER 1 |
| 3 | ESD2 I/O & POWER 1 TO GROUND |
| 4 | ESD3 I/O TO I/O'S |

APPARATUS FOR ELECTROSTATIC DISCHARGE (ESD) STRESS/TESTING

STATEMENT OF GOVERNMENT INTEREST

The invention described herein may be manufactured and used by or for the Government for governmental purposes without the payment of any royalty thereon.

This invention relates to an apparatus for electrostatic stress testing. Specifically, the present invention relates to an apparatus for establishing electrical connections between a high voltage pulse generator (HVPG) and several different combinations of the pins in sequence of a device under test (DUT) to apply electrostatic discharge stresses thereto.

BACKGROUND OF THE INVENTION

The performance of electrostatic discharge (ESD) testing and functional/parametric testing on a device under test (DUT) is not readily integrated into one automated apparatus because of the difficulty of isolating the high voltage pulses from the functional parametric tester. Also, there are severe difficulties involved in establishing connections between various pins of the device under test and the high voltage pulse generator in a way which results in similar stress to various pin combinations. Parasitic capacitance and inductance associated with the connection means may cause slowed rise time and variability from apparatus to apparatus. This has been found to cause test results to be inconsistent from tester to tester especially where different testers use different implementations of the connection and stressing means. Moreover, integration and automation of stressing and testing is highly desirable for high pin count devices, which have not been designed or made available to date. The present invention solves the problem of automating a laborious, time consuming electrostatic discharge testing sequence. This integration should speed testing by allowing testing to terminate after stressing the weakest device under test pin, since stressing and functional/parametric testing can be done in the same socket without removing the device under test.

SUMMARY OF THE INVENTION

The present invention provides means for establishing electrical connections between the pins of a device under test (DUT) and the terminals of a high voltage pulse generator (HVPG) for the purpose of electrostatic discharge stresses. The pins of the device under test are connected in several different combinations and sequences in order to perform the testing. The invention incorporates a novel set of cards (i.e., a contact card and a device under test card) which rest in parallel planes one over the other. A mounting means which is movable axially and rotationally, establishes an electrical contact between the cards. The angle of rotation between the contact card and the device under test card is varied to achieve various sets of connections between "pogo" pins that are connected to the device under test card and various sets of contact pads on the contact card which are connected to the electrostatic discharge tests and to the functional/parameter tester.

Another novel feature of the invention is the symmetrical arrangement of card sectors (i.e., areas between two radii) incorporating metal wiring patterns, multiple "pogo" pins and contact pads, which embodied on the cards results in very good ESD stressing impedance characteristic even for test involving different pins, pin combinations and the relative positions of the two cards.

These and other advantages, objects and features of the invention will become more apparent after considering the following description taken in conjunction with the illustrative embodiment in the accompanying drawings.

DETAILED DESCRIPTION OF THE INVENTION

Figure 1:
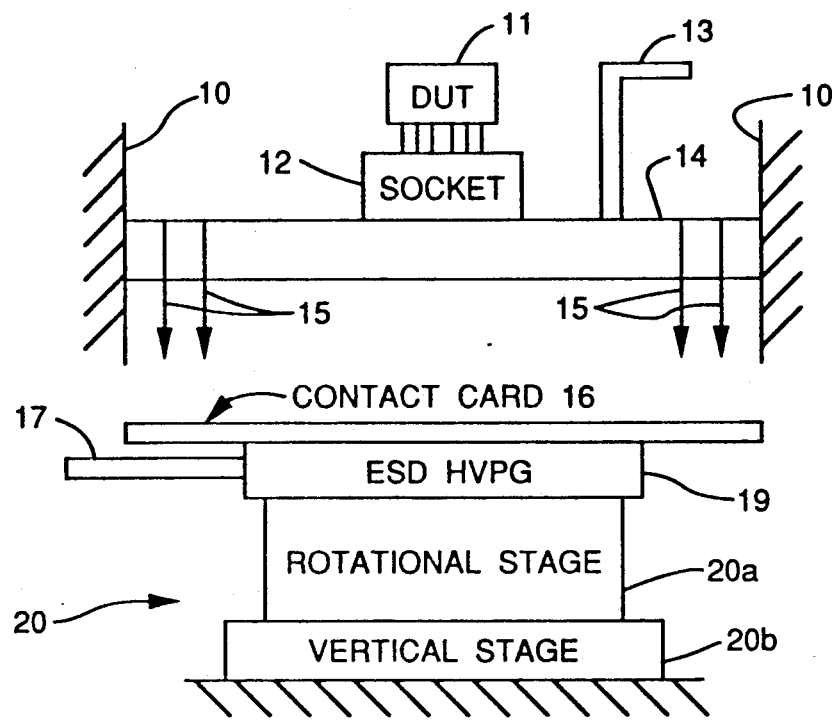
FIG. 1 is a schematic illustration of a first embodiment of the ESD tester device.
Figure 3:
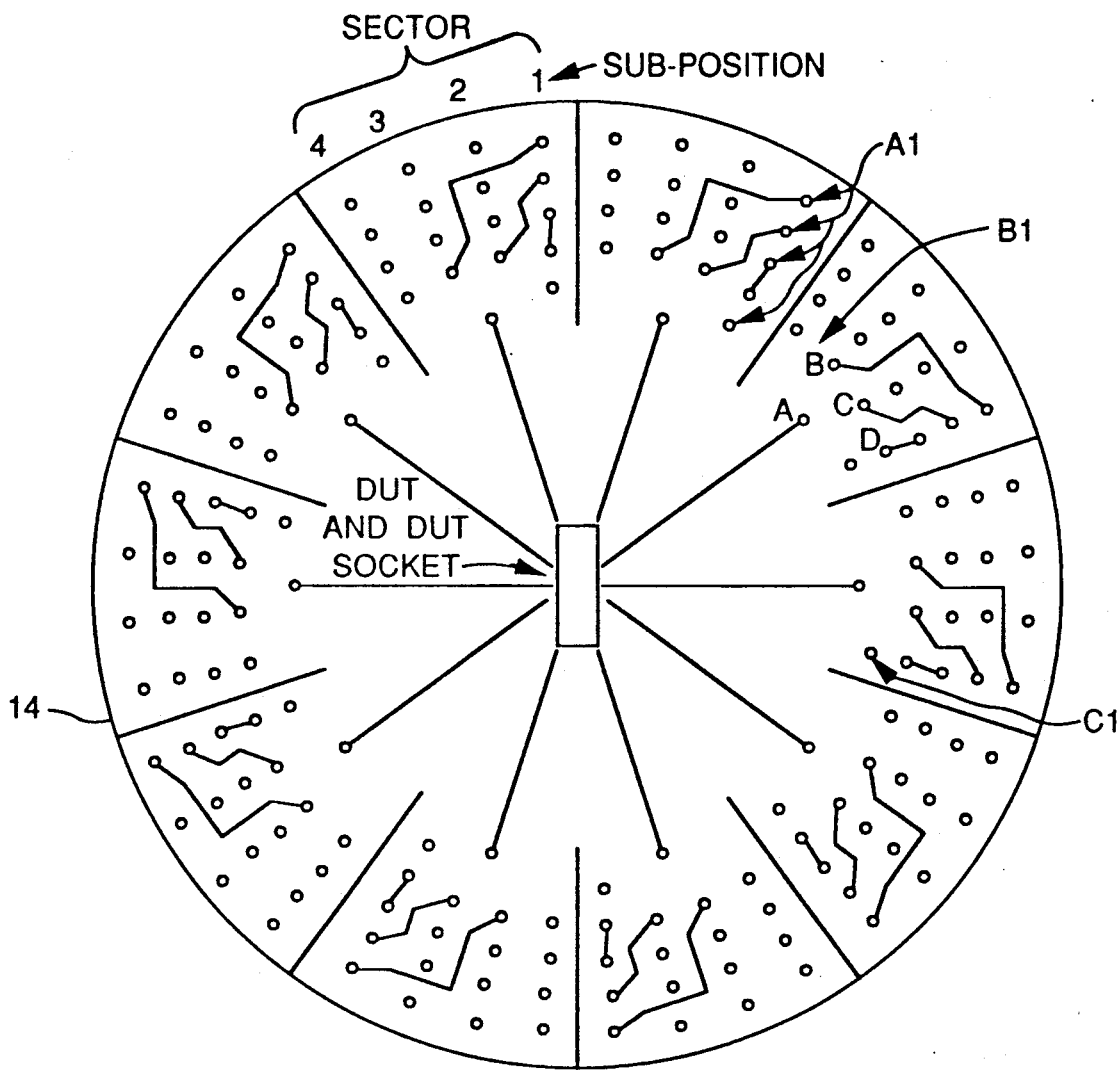
FIG. 3 is a plan view of the device under test card showing the radial sector pin details.

Referring to FIG. 1, which is a schematic illustration of a first embodiment of the implementation of the present invention, the apparatus comprises from top to bottom a device under test (DUT) 11, a DUT socket 12, in which the DUT 11 is inserted, a DUT card 14 supported in a mounting means 10 and connected to the DUT socket 12. A plurality of pogo pins 15 extend from the bottom side of the DUT card 14. Contact card 16 is shown fixed with respect to a movable stage 20 which comprises and is capable of both axial movement by vertical stage 20b and rotational movement by rotational stage 20a. The vertical and rotational movement of contact card 16 is such that it is aligned with the pogo pins 15 of DUT card 14. A cable 13 connects the DUT tester (not shown) to the DUT card 14 and through the DUT socket 12 to the DUT 11. A cable 17 is connected to the ESD high voltage pulse generator 19 which may be fabricated onto the contact card 16. Referring to FIG. 3, the DUT card 11 may be personalized by installing wire jumpers or other connection means between terminals or between pogo pins in predetermined positions of DUT card 14 depending on DUT pin type, including power input/output A-B, ground A-C and power A-D for ESD stressing.

Figure 2:
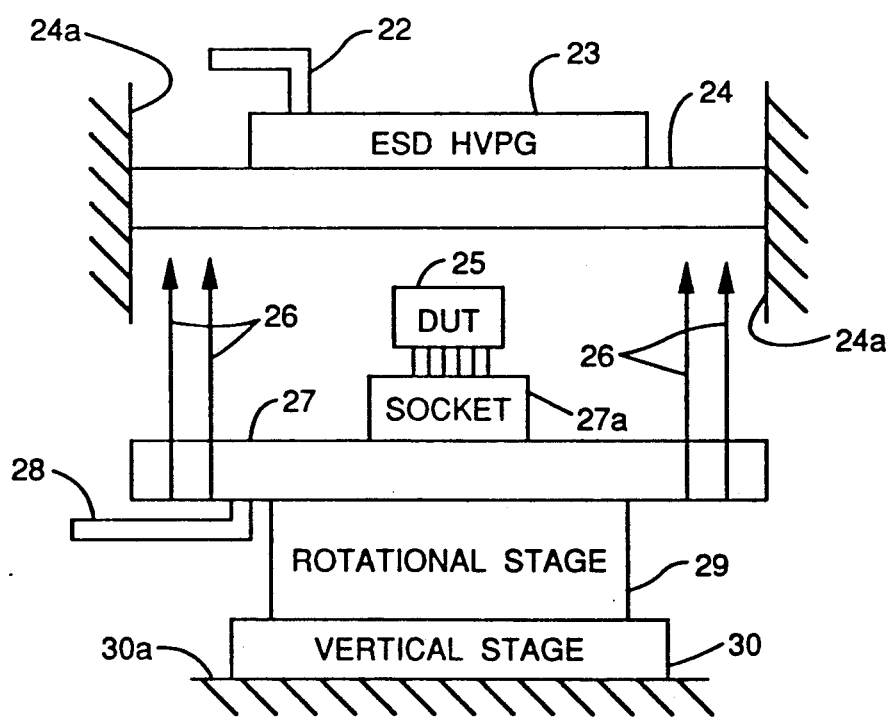
FIG. 2 is a schematic illustration of a second embodiment of the ESD tester device showing a different positioning of the contact card and the device under test card.

Referring briefly to FIG. 2, there is shown an alternate embodiment of the invention in which the contact card is held stationary and the DUT card is movable axially and rotationally. The device of FIG. 2 comprises from top to bottom a fixed contact card 24 mounted on a base 24a, and a terminal 22 to which the cable to ESD HVPG 23 is connected. A DUT 25 is connected to a DUT socket 27a that is mounted on DUT card 27. A plurality of pogo pins 26 extend upwardly for alignment with contacts of the contact card 24. The DUT card 27 is mounted on a rotational stage 29 which is in turn mounted to a vertical stage 30. Vertical stage 30 is fixed to a mounting means 30a. A cable to the DUT tester is connected to the DUT card 27 by a terminal 28. In this embodiment of the invention, the DUT card 27 is moved vertically by vertical stage 30 and rotated to align pogo pins 26 with contacts on contact card 24.

Figure 4:
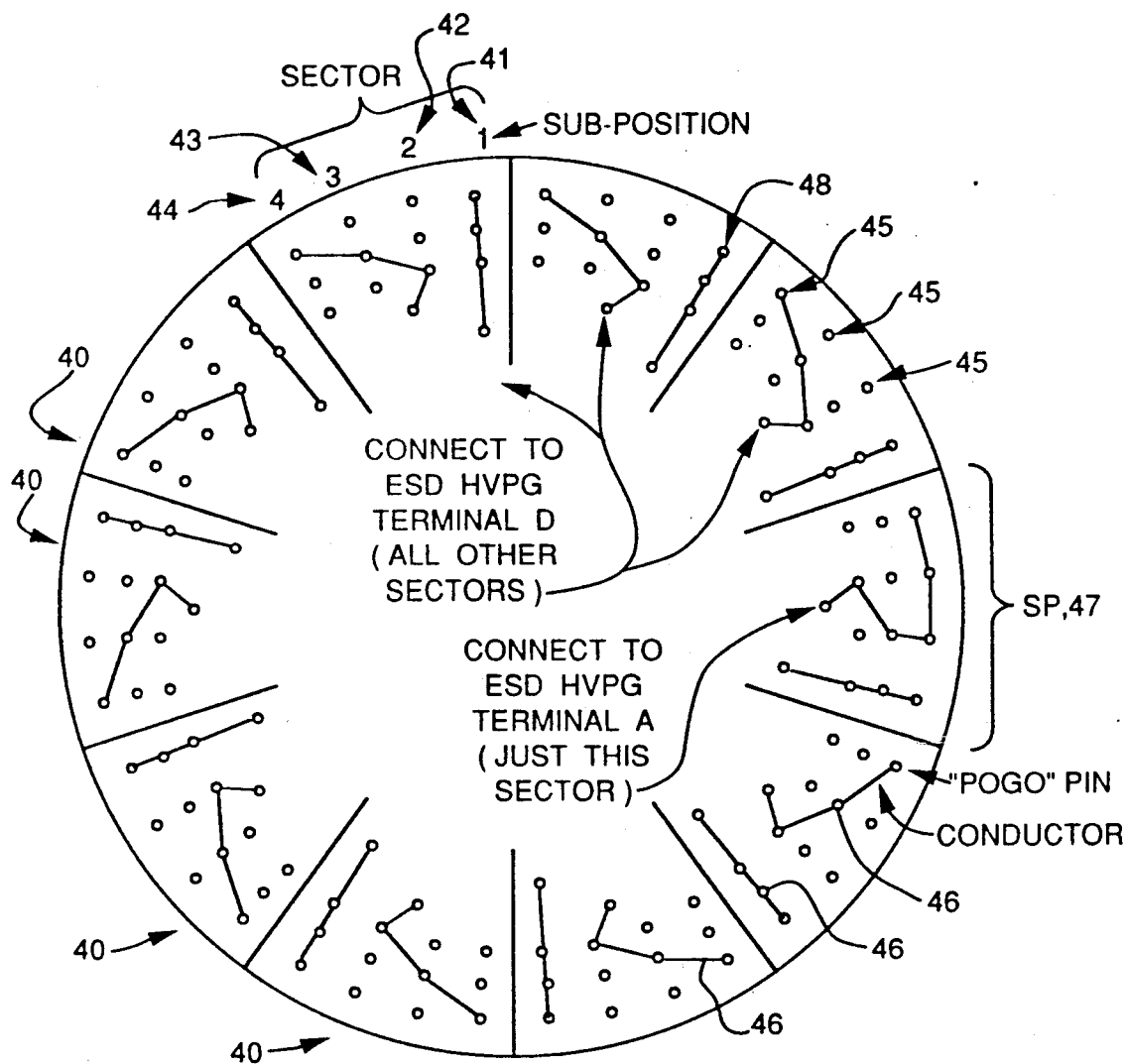
FIG. 4 is a plan view of the contact card showing the radial sector pin details.

Referring to FIG. 4 further details of the contact cards 16 and 24 are shown. The outer edge of the contact card is divided into sectors 40. Each sector 40 has an arrangement of contact pads 45 and metal conducting wiring lines 46. All sectors except one are fabricated initially to be the same. The sector 47 which is different from the others is used for applying stress from one terminal of the HVPG while the other sectors connect the other terminal of the HVPG to a combination of other pin types. The pin to be stressed is selected by separating and rotating the cards with respect to one another so that the sector of the pin to be stressed on the DUT card lines up with the special sector 47 of the contact card. The cards are then moved close enough to make contacts between them.

Further, each sector has several sub-positions 41-44 of rotation. In the special sector 47, the contact arrangements within these sub-positions are chosen to apply stress from one HVPG terminal to a single pin of a certain type and not to other pins of that type or to pins of other types by virtue of the distance from the center and radial subposition at which the DUT pin is connected to the contact card by a pogo pin. In other sectors, similar means are used to connect the other HVPG terminal to groups of certain pin types. A separate sub-position 48 on the contact card is used to connect all pogo pins from the DUT, regardless of pin type to the functional/parametric tester.

Figure 5:
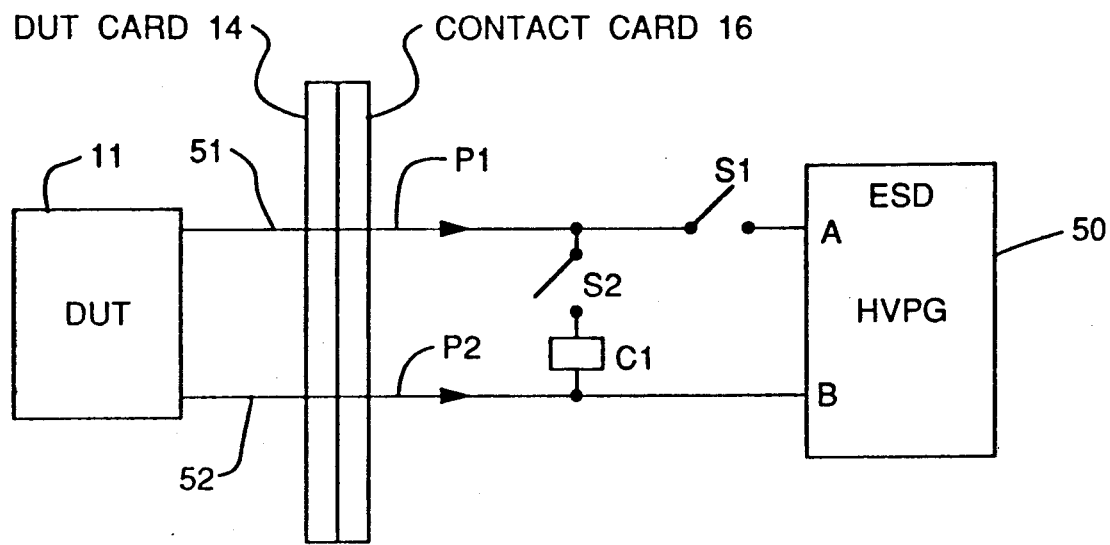
FIG. 5 shows a detail of pin type sensing using continuity test between ESD HVPG terminal and a device under test pin at a special sector.

Turning now to the simplified schematic representation FIG. 5, there is a further refinement of the invention. The DUT 11 is connected by wire leads 51 and 52 through the DUT card 14 and contact card 16 to pins $P_1$ and $P_2$ respectively. Pin $P_1$ connects through switch $S_1$ to terminal A of the ESD/HVPG tester 50. Pin $P_2$ is connected to terminal circuit C1 and then to terminal B of the ESD/HVPG tester 50. The other terminal of circuit C1 is connected to a switch $S_2$ which in turn is connected between $P_1$ and switch $S_1$. In operation to sense whether a connection by way of pogo pin $P_1$ is present, switch $S_1$ is opened and switch $S_2$ is closed. Circuit 1 is then used to force a limited current using a limited voltage in both polarities. If the current exceeds a present limit in one polarity or the other, a connection exists and ESD stress should be applied after opening switch $S_2$ and closing $S_1$. The ESD stressing sequence involves testing several pin combinations. These tests would be accomplished by rotating the cards to line up the special contact card sector over a DUT pin sector, sequencing through several sub-positions to apply stresses to several pin combinations, testing the DUT and then repeating the procedure at every DUT pin. However, for each pin of a certain type, one or more of the sub-positions are designed to prevent stress to pins of that certain type. Therefore, those sub-positions may be skipped over. These skippable sub-positions could be preselected by programming the control means (e.g., a computer) but it would be advantageous to sense them directly, simplifying test setup and software programming which would otherwise be required for different DUTs.

Built-in pin type sensing could be implemented in several ways. One possible way shown in FIG. 5 makes use of the fact that each pin of the DUT is connected through internal circuit paths to all other pins. Thus, it is possible to sense whether there is a connection between the terminal of the HVPG connected to the special contact card sector by forcing a limited current using a limited voltage in both polarities into the DUT while connecting other pins of the DUT to a different potential, while limiting the forcing voltage to prevent change in the DUT. If current does not flow for a reasonable forcing voltage in either polarity, then the pin is of a type not connected for the sub-position. This approach has the disadvantage of adding capacitance to the HVPG mode.

A further refinement of the present invention is envisioned in an apparatus with sub-positions added to apply several types of ESD stress. The drawings in FIG. 3 and 4 show three sub-positions for pin combinations required for "human body model" ESD stressing, however, this apparatus could also deliver other stresses such a the "charged device" and "machine model" stress by simply adding other sub-positions and connecting the contact pads appropriately. One limit that this imposes is closer wiring spacing, and associated increased capacitance between metal conductors.

Figure 6:
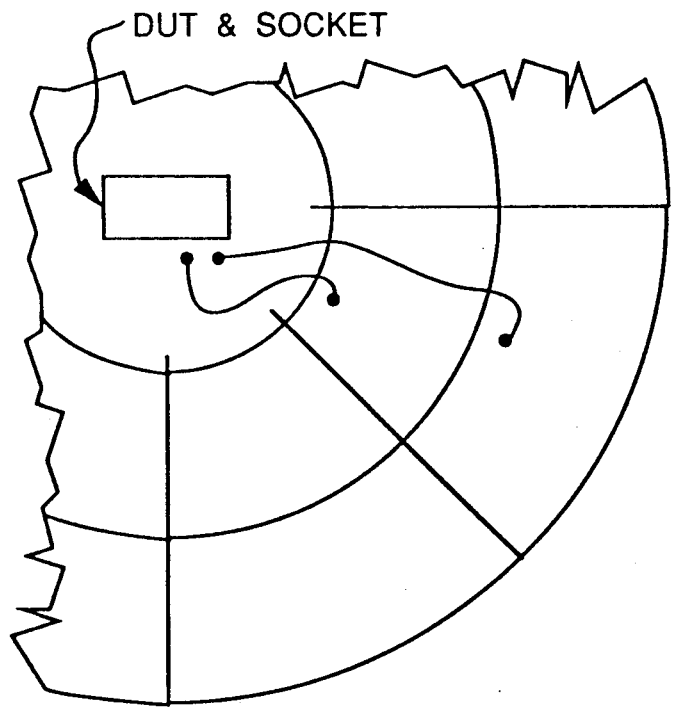
FIG. 6 shows a detail of multiple sector along a radius to ease horizontal metal trace spacing for high pin count devices.

A still further refinement of the apparatus is shown in FIG. 6. Multiple rows of sectors could be built in concentric rings around the cards, to ease wiring problems for very high pin count devices. This might have the disadvantage of differing performance for pins connected to outside rows versus those connected to inside rows of sectors.

Although the invention has been described with reference to a particular embodiment, it will be understood to those skilled in the art that the invention is capable of a variety of alternative embodiments within the spirit and scope of the appended claims.

What is claimed is:

1. An apparatus for applying high voltage, fast rise time electrical pulses simulating electrostatic discharge, and normal voltage and current signals to test for proper operation, to a device under test (DUT), said DUT having a plurality of contact pins, the combination comprising;

a DUT card, said DUT card having a plurality of pin contact means;

a contact card comprising pin selection and connection means; and means for supporting and adjusting the relative positions of said DUT card and said contact card, whereby said electrical pulses simulating electrostatic discharge, and normal voltage and current electrical signals can be applied to various combination of pins of the DUT, said DUT card having a radial sector for each pin of said device under test, each sector having a multiplicity of sub-positions connected by various patterns of conductors into a multiplicity of groups, said DUT card being fitted with means to establish contacts between said conductors associated with said groups, said means to establish contact comprising a multiplicity of collapsible protruding pins fixed to conductor patterns on one of the cards, and conductor pads on conductor patterns on the other of said cards.

2. An apparatus as described in claim 1 further including means for supplying pulses simulating electrostatic discharge.

3. An apparatus as described in claim 1 further including means for supplying normal voltage and current signals to test said device under test for proper operation.

4. An apparatus as described in claim 1 further including means for supplying pulses simulating electrostatic discharge and means for supplying normal voltage and current signals to test said device under test for proper operation.

5. An apparatus as described in claim 1 wherein said means for supporting and adjusting relative positions of said DUT card with pin contact means and said pin selection and connection means comprises a vertical mount and a rotational mount, capable of changing the relative positions of said DUT card with pin contact means and said pin selection and connection means so as to make or break contacts between them.

* * * * *